(12) United States Patent
Asamura

(10) Patent No.: US 8,576,020 B2
(45) Date of Patent: Nov. 5, 2013

(54) CRYSTAL OSCILLATOR AND METHOD OF MANUFACTURING THE SAME

(75) Inventor: Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/328,993

(22) Filed: Dec. 16, 2011

(65) Prior Publication Data

US 2012/0154061 A1    Jun. 21, 2012

(30) Foreign Application Priority Data

Dec. 20, 2010 (JP) ................................. 2010-283335

(51) Int. Cl.
*H03B 5/32* (2006.01)

(52) U.S. Cl.
USPC ................. 331/158; 331/116 R; 331/116 FE; 331/68; 331/176

(58) Field of Classification Search
USPC .................... 331/158, 116 R, 116 FE, 68, 176
See application file for complete search history.

(56) References Cited

U.S. PATENT DOCUMENTS

| | | | |
|---|---|---|---|
| 6,720,837 B2 * | 4/2004 | Moriya et al. | 331/158 |
| 7,522,006 B2 * | 4/2009 | Mizumura et al. | 331/158 |
| 2001/0045626 A1 | 11/2001 | Hirose | |

FOREIGN PATENT DOCUMENTS

JP    2003-204017 A    7/2003

OTHER PUBLICATIONS

Oyama, H. et al., Application of radiation, Technology on MOS Circuit Decision, Manufacturing and Reliability, Apr. 2008, pp. 174-177, Japan.

* cited by examiner

*Primary Examiner* — Arnold Kinkead
(74) *Attorney, Agent, or Firm* — Knobbe Martens Olson & Bear LLP

(57) ABSTRACT

A crystal oscillator with improved tolerance to radiation such as X-rays includes: a container body; a quartz crystal blank accommodated in a first recess formed on one main surface of the container body and hermetically encapsulated in the first recess by a metal cover; and an IC chip that integrates electronic circuits including at least an oscillator circuit using the crystal blank and is accommodated in the second recess formed on the other main surface of the container body. The IC chip is fixed to the bottom surface of the second recess by flip-chip bonding such that a circuit formation plane of the IC chip is opposed to the bottom surface of the second recess. A radiation protective film is formed on the main surface other than the circuit formation plane of the IC chip.

7 Claims, 2 Drawing Sheets

CRYSTAL OSCILLATOR AND METHOD OF MANUFACTURING THE SAME

BACKGROUND OF THE INVENTION

1. Field of the Invention:

The present invention relates to a quartz crystal oscillator that packages a quartz crystal blank and an IC (integrated circuit) chip, which integrates an oscillator circuit using the crystal blank, into a container having a recess in each of both main surfaces. In particular, the present invention relates to a crystal oscillator with improved tolerance to radiation such as X-rays, and a method of manufacturing the same.

2. Description of the Related Art:

The crystal oscillator configured by packaging the crystal blank and the IC chip integrating the oscillator circuit using the crystal blank into a container can easily adopt a configuration of a surface mount component, and is widely built-in as a reference source of frequency and time in a mobile electronic device, for example, typified by a mobile phone.

There are various configurations housing the crystal blank and the IC chip in the crystal oscillator. One configuration among them employs a container body that has a recess on each of both main surfaces and is formed to have an H-shape in a sectional view, and separately accommodates the IC chip and the crystal blank in the recesses. FIG. 1A is a sectional view showing an example of a configuration of such a crystal oscillator in a related art. FIG. 1B is a bottom view of the crystal oscillator shown in FIG. 1A.

The crystal oscillator shown in FIGS. 1A and 1B has a surface mount configuration suitable for surface-mounting on a circuit board or a wiring board, and includes container body 1 having recesses 1a and 1b in both respective main surfaces. Crystal blank 2 is accommodated in one recess 1a of container body 1, and IC chip 3 is accommodated in the other recess 1b. Mounting electrodes 11, which are used for surface-mounting the crystal oscillator on a circuit board or the like, are provided at four corners of the end surface surrounding recess 1b in container body 1. Mounting electrode 11 includes, for example, a power supply terminal, a ground terminal, and an oscillation output terminal.

Crystal blank 2 is, for example, an AT-cut quartz crystal blank having a substantially rectangular shape, and includes an excitation electrode (not shown) on each of both main surfaces. Extending electrodes extend from the excitation electrodes toward both sides of one end of crystal blank 2, respectively. Both the sides of the one end of crystal blank 2, to which the respective extending electrodes extend, are fixed to crystal holding terminal 4 provided on the bottom of one recess 1a of container body 1 by conductive adhesive 5. Metal ring 6 is provided at an end surface of container body 1 surrounding recess 1a. Metal cover 7 is bonded with metal ring 6 by seam welding, thereby hermetically encapsulating crystal blank 2 in recess 1a.

IC chip 3 is formed by integrating electronic circuits including an oscillator circuit using crystal blank 2 on a semiconductor substrate, and accommodated in the other recess 1b of container body 1. A silicon substrate is widely employed as a semiconductor substrate. These electronic circuits are formed on one main surface of the semiconductor substrate constituting IC chip 3. This main surface is referred to as a circuit formation plane. IC terminals 8 for electrical connection to the electronic circuits in IC chip 3 from the outside are provided on the circuit formation plane of IC chip 3. IC terminals 8 include, for example, a pair of crystal connecting terminals used for electrical connection to crystal blank 2, a power supply terminal, a ground terminal, and an output terminal.

Connection electrodes 9 are provided on the bottom surface of recess 1b according to IC terminals 8. IC chip 3 is fixed to the bottom surface of recess 1b by flip-chip bonding using bumps 10. At this time, IC terminals 8 and corresponding connection electrodes 9 are electrically and mechanically connected to each other by bumps 10. Connection electrodes 9 corresponding to the crystal connecting terminals among IC terminals 8 are electrically connected to crystal holding terminals 4 on the bottom surface of recess 1a by conductive paths that are formed in container body 1 including a via holes (not shown). Accordingly, crystal blank 2 is electrically connected to the oscillator circuit inside IC chip 3. Connection electrodes 9 corresponding to the power supply terminal, the ground terminal, the oscillation output terminal and the like among IC terminals 8 are electrically connected to corresponding mounting electrodes 11 via conductive paths provided in container body 1.

The electronic circuit integrated into IC chip 3 in the crystal oscillator is not limited to the oscillator circuit. For example, an electronic circuit such as a temperature compensating circuit can be integrated into IC chip 3; the temperature compensating circuit compensates temperature-frequency characteristics of crystal blank 2 and can acquire a constant oscillation frequency irrespective of the ambient temperature. A crystal oscillator capable of highly accurately maintaining the oscillation frequency against temperature variation by incorporating a temperature compensating circuit is referred to as a temperature compensated crystal oscillator (TCXO).

In recent years, as typified by airport security screening, X-ray screening using relatively low intensity X-rays has widely been used. In general, in a semiconductor integrated circuit, as described in Section 5.9 "Application of Radiation" in "Technology on MOS Circuit Design, Manufacturing and Reliability", Hidenori Oyama, Masakazu Nakabayashi, Kiyoteru Hayama, and Kei Eguchi, Morikitashuppan, April 2008 (ISBN 978-4-627-77381-3), it is known that when ionizing radiation, such as X-rays and γ-rays, is incident, device characteristics may vary. Repeated application of radiation accumulates variation. This accumulation of variation is referred to as a total dose effect. In the crystal oscillator, application of X-rays slightly changes the oscillation frequency. In a case where the crystal oscillator is a TCXO, the frequency accuracy is originally high. Accordingly, even X-ray application in low intensity X-ray screening can cause a problem of frequency change owing to the application of radiation.

Conventionally, methods of protection against radiation in electronic devices include, for example, a method of manufacturing a semiconductor integrated circuit by a special fabrication process or a method of housing the entire electronic device in a radiation shield. However, these methods are for high energy or high dose radiation, and have a large-scale configuration and significantly increase manufacturing cost. These methods are not necessarily optimal as measures against low intensity X-ray application in airport security screening and the like.

Measures against electromagnetic noise in an extent of wireless frequencies at an individual component level or part level include, for example, those described in JP2001-319987A and US2001/0045626. However, radiation such as X-rays and electromagnetic noise with frequencies of several hundred gigahertz at the highest are completely different from each other in physical properties, especially in fundamental principle of effect to be exerted on the electronic circuit. The techniques described in JP2001-319987A and US 2001/0045626 cannot be utilized in measures against application of ionizing radiation as they are.

As described above, X-ray screening using relatively low energy and low dose X-rays, such as thorough airport security screening, has widely been conducted in recent years. Along therewith, particularly in a crystal oscillator that outputs highly accurate oscillation frequencies, such as a TCXO, there have been concerns about frequency change along with X-ray application.

SUMMARY OF THE INVENTION

It is an object of the present invention to provide a crystal oscillator that is not large scale, is not accompanied by significant increase in cost, has a small change in characteristics in a case of application of ionizing radiation such as X-ray application, and can maintain a constant oscillation frequency.

It is another object of the present invention to provide a method of manufacturing a crystal oscillator that is not large scale, is not accompanied by significant increase in cost, has a small change in characteristics in a case of application of ionizing radiation such as X-ray application, and can maintain a constant oscillation frequency.

According to an aspect of the present invention, a crystal oscillator includes: a container body including first and second main surfaces; a crystal blank accommodated in a first recess formed in the first main surface; a metal cover that closes the first recess to hermetically encapsulate the crystal blank in the first recess; and an IC chip that integrates an electronic circuit including at least an oscillator circuit using the crystal blank and is accommodated in a second recess formed in the second main surface, wherein the electronic circuit is formed on a circuit formation plane that is one main surface of the IC chip, the IC chip is fixed to a bottom surface of the second recess by flip-chip bonding such that the circuit formation plane is opposed to the bottom surface of the second recess, and a radiation protective film is formed on the other main surface of the IC chip.

In the crystal oscillator based on the present invention, ionizing radiation to be incident on the circuit formation plane into the IC chip is absorbed by the metal cover. Ionizing radiation to be incident on the main surface other than the circuit formation plane of the IC chip into this IC chip is absorbed by the radiation protective film. Accordingly, in this crystal oscillator, even in a case of application of radiation, the radiation does not adversely affect the electronic circuit in the IC chip. This allows change in characteristics of the crystal oscillator to be reduced, thereby enabling a constant oscillation frequency to be maintained.

According to another aspect of the present invention, a method of manufacturing a crystal oscillator is a method of manufacturing a crystal oscillator which includes: a container body including first and second main surfaces; a crystal blank that is accommodated in a first recess formed in the first main surface; a metal cover that closes the first recess to hermetically encapsulate the crystal blank in the first recess; and an IC chip that integrates an electronic circuit including at least an oscillator circuit using the crystal blank and is accommodated in a second recess formed in the second main surface, the method including: forming the electronic circuits whose number corresponds to that of a plurality of the IC chips at one time on a circuit formation plane that is one main surface of a semiconductor wafer which has a size corresponding to sizes of the plurality of the IC chips; forming a radiation protective film corresponding to the plurality of the IC chips on the other main surface of the semiconductor wafer at one time; cutting out the individual IC chips from the semiconductor wafer on which the electronic circuits and the radiation protective film are formed; and fixing the IC chip having been cut out, by flip-chip bonding, to a bottom surface of the second recess of the container body at which the crystal blank has preliminarily been encapsulated hermetically in the first recess such that the circuit formation plane is opposed to the bottom surface of the second recess.

This manufacturing method allows the radiation protective film corresponding to a plurality of IC chips to be formed at one time, thereby preventing reduction in productivity accompanied by providing the radiation protective film.

DETAILED DESCRIPTION OF THE PREFERRED EMBODIMENT

Figure 1A:
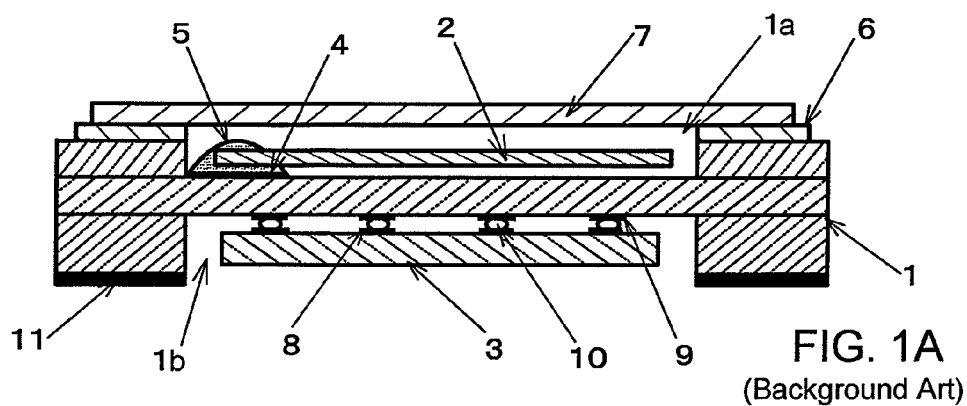
FIG. 1A is a sectional view showing an example of a configuration of a crystal oscillator of a related art.
Figure 1B:
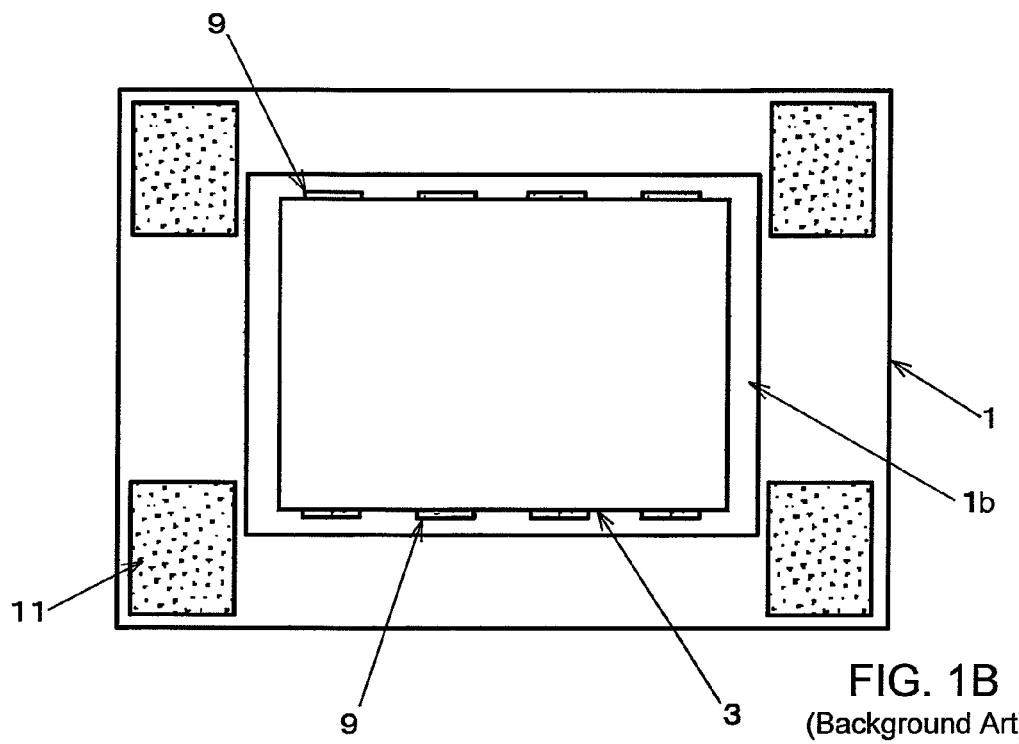
FIG. 1B is a bottom view of the crystal oscillator shown in FIG. 1A.
Figure 2A:
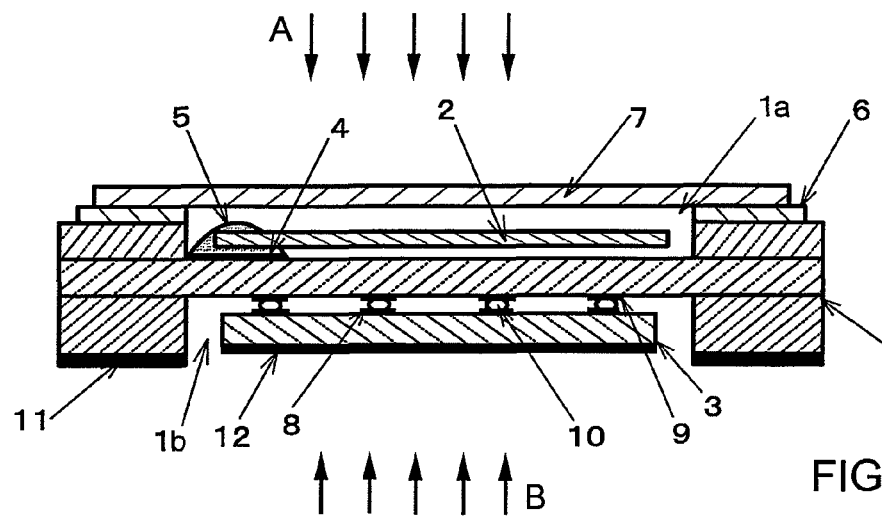
FIG. 2A is a sectional view showing a configuration of a crystal oscillator according to an embodiment of the present invention.
Figure 2B:
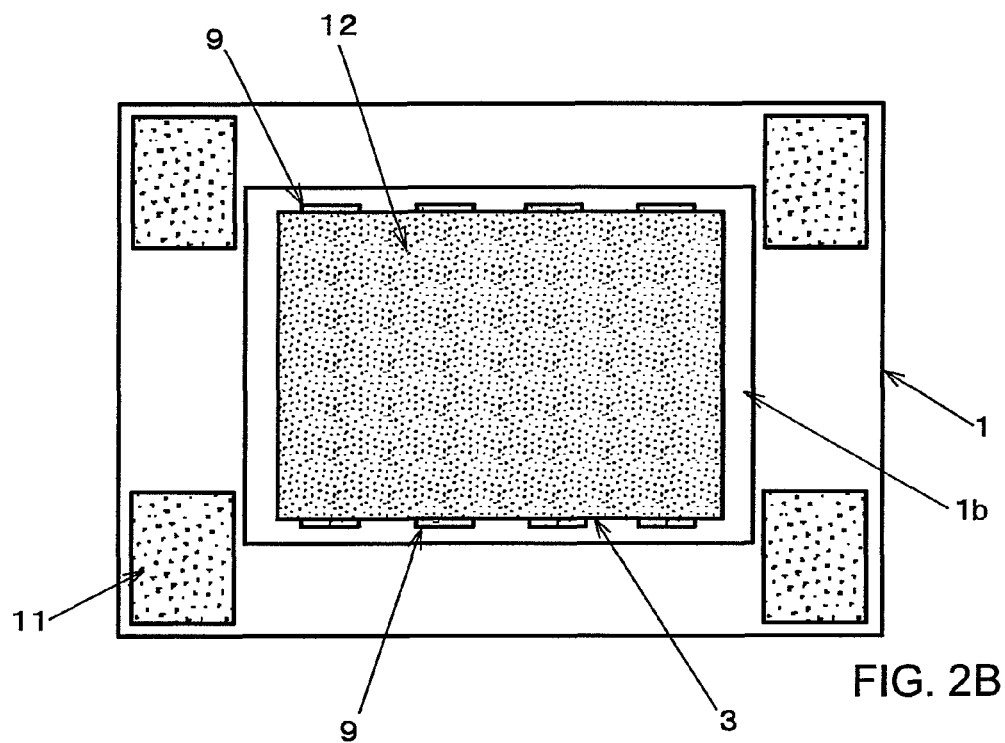
FIG. 2B is a bottom view of the crystal oscillator shown in FIG. 2A.

In FIGS. 2A and 2B showing a crystal oscillator according to an embodiment of the present invention, parts and constituents identical to those in FIGS. 1A and 1B are assigned with identical reference numerals, and description thereof is simplified or omitted.

The crystal oscillator of the present embodiment shown in FIGS. 2A and 2B has a surface mount configuration as with that shown in FIGS. 1A and 1B, and employs container body 1 where recesses 1a and 1b are formed on both respective main surfaces. Crystal blank 2 is housed in one recess 1a, and IC chip 3 is housed in other recess 1b. The crystal oscillator has a shape of a flat and substantially rectangular parallelepiped as a whole. The container body is made of, for example, a laminated ceramic. Mounting electrodes 11 used for surface-mounting the crystal oscillator on a circuit board or the like are provided on respective four corners of the end surface surrounding recess 1b. Crystal blank 2 is an AT-cut quartz crystal blank that has a substantially rectangular shape and includes the excitation electrodes and extending electrodes as with that shown in FIGS. 1A and 1B. Crystal blank 2 is fixed to crystal holding terminals 4, and hermetically encapsulated in recess 1a by metal cover 7. Metal cover 7 is made of, for example, Kovar with a thickness of 0.1 mm or the like. Kovar is a kind of an alloy made by mixing nickel and cobalt into iron.

In this embodiment, the crystal oscillator is configured as a TCXO. Accordingly, in IC chip 3, an oscillator circuit using crystal blank 2 and a temperature compensating circuit compensating temperature-frequency characteristics of crystal blank 2 are formed, as the electronic circuits, on a substantially rectangular semiconductor substrate made of silicon. These electronic circuits are formed on a circuit formation plane, which is one main surface of the semiconductor substrate. Further, IC terminals 8 electrically connected to the electronic circuits are provided on the circuit formation plane. IC terminals 8 include, for example, crystal connecting terminals, a power supply terminal, a ground terminal and an oscillation output terminal. Connection electrodes 9 are provided on the bottom surface of recess 1b according to respective IC terminals 8. IC chip 3 is fixed to the bottom surface of recess 1b by flip-chip bonding using bumps 10 between IC terminals 8 and connection electrodes 9. According to this configuration, as with those shown in FIGS. 1A and 1B, the electronic circuits in IC chip 3 are electrically connected to crystal blank 2 and mounting electrodes 11.

Further, in the crystal oscillator, radiation protective film 12 made of a material which absorbs ionizing radiation such as X-rays is provided on the main surface, which is the back surface, other than the circuit formation plane of both the main surfaces of IC chip 3.

Next, tolerance of the crystal oscillator of this embodiment against application of ionizing radiation will be described.

A case of application of low intensity X-rays for X-ray screening is considered. As to the crystal oscillator including the crystal blank and the IC chip, adverse effects of X-ray application occur mainly in the electronic circuits in the IC chip. In the crystal oscillator of this embodiment, crystal blank 2 is hermetically encapsulated in recess 1a formed on the one main surface of container body 1, and IC chip 3 is housed in recess 1b formed on the other main surface. Accordingly, X-rays indicated by arrows A in FIG. 2A to be incident on the circuit formation plane, that is, the main surface close to crystal blank 2 of the two main surfaces of IC chip 3, are to be transmitted through metal cover 7 and the excitation electrodes on crystal blank 2. As described above, metal cover 7 is made of, for example, an iron alloy such as Kovar with a thickness of 0.1 mm or the like, and the excitation electrodes are made of deposited film of, for example, chromium, gold or silver. The X-rays indicated by arrows A are absorbed by metal cover 7 and the excitation electrodes on crystal blank 2 before reaching IC chip 3, and are thus attenuated when reaching IC chip 3.

On the other hand, X-rays indicated by arrows B in FIG. 2A to be incident on the back surface, that is, the main surface distant from crystal blank 2 of the two main surfaces of IC chip 3, are to reach the electronic circuits in IC chip 3 only via a silicon layer constituting the semiconductor substrate of IC chip 3 if a radiation protective film is not thereon. Silicon has a small X-ray mass absorption coefficient and a density of 2.34 g/cm³, which are smaller than those of a metal such as an iron constituting metal cover 7. Accordingly, if the radiation protective film is not thereon, the X-rays indicated by arrows B easily reach the electronic circuits in IC chip 3, and change the characteristics and the oscillation frequency of the crystal oscillator.

Thus, in this embodiment, radiation absorption film 12 is provided on the back surface of IC chip 3 to absorb X-rays indicated by arrows B in the diagram by radiation absorption film 12, and attenuates the X-rays which are to reach a part of IC chip 3 including the electronic circuits. According to the above discussion, it is understood that the X-ray absorptivity of radiation absorption film 12 may be, for example, in the same extent of the total X-ray absorptivity of metal cover 7 and the excitation electrodes on crystal blank 2.

In general, intensity I of X-rays having been transmitted through a specimen is represented as follows according to the Lambert-Beer law, $$I = I_0 e^{-\mu \rho L},$$

where $I_0$ indicates the intensity of initial X-rays incident on the specimen, L indicates the thickness of the specimen, $\rho$ indicates the density of the specimen, and $\mu$ indicates the X-ray mass absorption coefficient of the specimen. The X-ray mass absorption coefficient corresponds to an X-ray absorption cross section. According to the above equation, it is understood that the absorption of X-ray increases with increase of L, $\rho$ and $\mu$, thereby reducing the intensity of transmitted X-rays. It is preferable that radiation absorption film 12 provided on the back surface of IC chip 3 have a thickness smaller than that of IC chip 3 in consideration of ease and cost of formation thereof. Accordingly, it is preferable to adopt a material having at least one of density $\rho$ and X-ray mass absorption coefficient $\mu$ larger than that of silicon constituting IC chip 3.

X-ray mass absorption coefficients are different among constitutive elements of materials and also vary according to energy of X-rays. With the same material, except in the case of a position referred to as the absorption edge that photoelectric absorption due to interaction with an orbital electron increases the mass absorption coefficient in a stepwise manner, the general tendency is that the mass absorption coefficient decreases with increase of the energy of X-rays. For example, the mass absorption coefficient of silicon with respect to X-rays with an energy of 1 keV is $3.05 \times 10^3$ cm²/g, while the mass absorption coefficient of iron is $1 \times 10^4$ cm²/g. Table 1 shows densities $\rho$, and mass absorption coefficients $\mu$ with respect to X-rays with an energy of 1 keV of simple substances for several elements.

TABLE 1

| Element | Density $\rho$ (g/cm³) | X-ray mass absorption coefficient $\mu$ (cm²/g) |
|---|---|---|
| Beryllium (Be) | 1.84 | $5 \times 10^2$ |
| Carbon (C) | 2.53 | $2 \times 10^3$ |
| Aluminum (Al) | 2.69 | $1 \times 10^3$ |
| Silicon (Si) | 2.34 | $3.05 \times 10^3$ |
| Iron (Fe) | 7.86 | $1 \times 10^4$ |
| Nickel (Ni) | 8.85 | $1 \times 10^4$ |
| Copper (Cu) | 8.93 | $1 \times 10^4$ |
| Molybdenum (Mo) | 10.2 | $5 \times 10^3$ |
| Ruthenium (Ru) | 12.06 | $6 \times 10^3$ |
| Tungsten (W) | 19.1 | $4 \times 10^3$ |
| Gold (Au) | 19.3 | $5 \times 10^3$ |

Materials that have a density higher than that of silicon and are suited for radiation protective film 12 are, for example, aluminum, iron, nickel, copper, molybdenum, ruthenium, tungsten, gold and the like. Further, titanium, chromium and silver are listed even though these are not in the above table. Materials that have an X-ray mass absorption coefficient higher than that of silicon and are suited for radiation protective film 12 are iron, nickel, copper, molybdenum, ruthenium, tungsten, gold and the like.

Radiation protective film 12 can be formed, for example, by forming the electronic circuits and IC terminals 8 on the circuit formation plane of the semiconductor substrate made of silicon according to a well-known fabricating process of a semiconductor device, subsequently back-grinding the back surface of the semiconductor substrate, then forming a thin chromium layer on the back-ground surface by spattering in order to increase intimate contact between silicon and gold, and further forming a gold layer to be a main body of radiation protective film 12 by spattering. In a case of forming a gold layer to be radiation protective film 12 having a thickness of, for example, at least several micrometers in a short time period, a plating method may be used together.

In manufacturing IC chip 3, for the sake of improving productivity, a semiconductor wafer having a size corresponding to sizes of a plurality of IC chips 3 is typically used, the electronic circuits and IC terminals 8 corresponding to the number of IC chips are formed on the semiconductor wafer at one time, subsequently individual IC chips are cut out of the semiconductor wafer, and thus one batch of carrying out the fabricating steps of semiconductor device acquires the plurality of IC chips 3 at the same time. In a case of being subjected to such steps, it is suffice that the steps of backgrinding and forming radiation protective film 12 are performed, after the electronic circuits and IC terminals 8 corresponding to the number of IC chips on the semiconductor wafer have been formed at one time, and before individual IC chips 3 are cut out. This enables radiation protective films 12 to be also formed for the plurality of IC chips 3 at one time, thereby preventing reduction in productivity accompanied by providing radiation protective film 12. In particular, in the case of forming IC terminals 8 on IC chip 3 by means of a gold plated layer, radiation protective film 12 may also be configured by a gold layer, thereby allowing this formation to be performed at the same time as formation of IC terminals 8 and radiation protective films 12. This enables radiation protective film 12 to be efficiently formed.

IC chip 3 made as described above is fixed by flip-chip bonding using bumps 10 to container body 1 where crystal holding terminals 4, connection electrodes 9 and mounting electrodes 11 have preliminarily be provided and crystal blank 2 has already been encapsulated hermetically in recess 1a. The crystal oscillator is thus completed.

What is claimed is:

1. A crystal oscillator comprising:
   a container body including first and second main surfaces;
   a crystal blank accommodated in a first recess formed in the first main surface;
   a metal cover that closes the first recess to hermetically encapsulate said crystal blank in the first recess; and
   an IC chip that integrates an electronic circuit including at least an oscillator circuit using said crystal blank and is accommodated in a second recess formed in the second main surface,
   wherein the electronic circuit is formed on a circuit formation plane that is one main surface of said IC chip,
   said IC chip is fixed to a bottom surface of the second recess by flip-chip bonding such that the circuit formation plane is opposed to the bottom surface of the second recess,
   a radiation protective film is formed on the other main surface of said IC chip, and
   the radiation protective film is a film having a density higher than that of a material of a semiconductor substrate configuring said IC chip.

2. A crystal oscillator comprising:
   a container body including first and second main surfaces;
   a crystal blank accommodated in a first recess formed in the first main surface;
   a metal cover that closes the first recess to hermetically encapsulate said crystal blank in the first recess; and
   an IC chip that integrates an electronic circuit including at least an oscillator circuit using said crystal blank and is accommodated in a second recess formed in the second main surface,
   wherein the electronic circuit is formed on a circuit formation plane that is one main surface of said IC chip,
   said IC chip is fixed to a bottom surface of the second recess by flip-chip bonding such that the circuit formation plane is opposed to the bottom surface of the second recess,
   a radiation protective film is formed on the other main surface of said IC chip, and
   the radiation protective film is configured by a material having an X-ray mass absorption coefficient higher than that of a material of a semiconductor substrate configuring said IC chip.

3. The crystal oscillator according to claim 1, wherein the radiation protective film is configured by a material having an X-ray mass absorption coefficient higher than that of a material of a semiconductor substrate configuring said IC chip.

4. The crystal oscillator according to claim 1, configured as a surface mount temperature compensated crystal oscillator.

5. A method of manufacturing a crystal oscillator that includes: a container body including first and second main surfaces; a crystal blank that is accommodated in a first recess formed in the first main surface; a metal cover that closes the first recess to hermetically encapsulate said crystal blank in the first recess; and an IC chip that integrates an electronic circuit including at least an oscillator circuit using said crystal blank and is accommodated in a second recess formed in the second main surface, the method comprising:
   forming the electronic circuits whose number corresponds to that of a plurality of said IC chips at one time on a circuit formation plane that is one main surface of a semiconductor wafer which has a size corresponding to sizes of the plurality of said IC chips;
   forming a radiation protective film corresponding to the plurality of said IC chips on the other main surface of the semiconductor wafer at one time;
   cutting out said individual IC chips from the semiconductor wafer on which the electronic circuits and the radiation protective film are formed; and
   fixing said IC chip having been cut out, by flip-chip bonding, to a bottom surface of a second recess of said container body at which said crystal blank has preliminarily been encapsulated hermetically in the first recess, such that the circuit formation plane is opposed to the bottom surface of the second recess.

6. The method according to claim 5,
   wherein the flip-chip bonding is flip chip bonding that uses a bump, and
   the method forms an IC terminal used for bonding with the bump, on the circuit formation plane, at the same time in said forming the radiation protective film.

7. The crystal oscillator according to claim 2, configured as a surface mount temperature compensated crystal oscillator.

* * * * *